US012478179B2

(12) United States Patent
Lin et al.

(10) Patent No.: US 12,478,179 B2
(45) Date of Patent: Nov. 25, 2025

(54) SLIDING RAIL

(71) Applicant: FOSITEK CORPORATION, New Taipei (TW)

(72) Inventors: Chun-Han Lin, New Taipei (TW); Che-Wei Chang, New Taipei (TW); Hao-Ping Wang, New Taipei (TW); Jia-Wei Pan, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 82 days.

(21) Appl. No.: 18/661,327

(22) Filed: May 10, 2024

(65) Prior Publication Data

US 2025/0215924 A1 Jul. 3, 2025

(30) Foreign Application Priority Data

Dec. 27, 2023 (TW) ................................ 112151001

(51) Int. Cl.
*A47B 88/49* (2017.01)
*A47B 88/423* (2017.01)
(Continued)

(52) U.S. Cl.
CPC .......... *A47B 88/423* (2017.01); *A47B 88/473* (2017.01); *A47B 88/477* (2017.01); *A47B 88/57* (2017.01); *A47B 2088/4235* (2017.01); *A47B 88/487* (2017.01); *A47B 88/493* (2017.01); *A47B 2210/0018* (2013.01); *A47B 2210/0059* (2013.01); *A47B 2210/0081* (2013.01); *F16C 29/02* (2013.01); *H05K 7/1489* (2013.01)

(58) Field of Classification Search
CPC ... A47B 88/423; A47B 88/473; A47B 88/477; A47B 88/57; A47B 88/49; A47B 88/493; A47B 88/487; A47B 2088/4235; A47B 2210/0018; A47B 2210/0059; A47B 2210/0081
See application file for complete search history.

(56) References Cited

U.S. PATENT DOCUMENTS 6,367,899 B1 * 4/2002 Hwang .................. A47B 88/57
312/334.47
6,412,891 B1 * 7/2002 Liang .................. A47B 88/487
312/334.44
(Continued)

*Primary Examiner* — Kimberley S Wright
(74) *Attorney, Agent, or Firm* — Birch, Stewart, Kolasch & Birch, LLP

(57) ABSTRACT

A sliding rail adapted to be engaged with an engaging member, and includes a track and a limiting mechanism. The track includes a base wall having first and second ends, and two side walls. The limiting mechanism includes an operating member, a limiting member, first and second positioning members, and a connecting member. The limiting member has a limiting body, a pivoting portion, and two limiting portions. The operating member is formed with a linking slot that has a first linking slot end, a second linking slot end, and a linking slot tip. The limiting body has two pivoting slots. The operating member is operable to drive the limiting member to move among a locked position where the engaging member is contained in a limiting space, and first and second unlocked positions which opens the limiting space, allowing the engaging member to be released from the limiting space.

6 Claims, 6 Drawing Sheets

(51) Int. Cl.

| | |
|---|---|
| ***A47B 88/473*** | (2017.01) |
| ***A47B 88/477*** | (2017.01) |
| ***A47B 88/483*** | (2017.01) |
| ***A47B 88/57*** | (2017.01) |
| *A47B 88/487* | (2017.01) |
| *A47B 88/493* | (2017.01) |
| *F16C 29/02* | (2006.01) |
| *H05K 7/14* | (2006.01) |

(56) References Cited

U.S. PATENT DOCUMENTS

| | | | | |
|---|---|---|---|---|
| 8,317,278 | B2 * | 11/2012 | Enos | A47B 88/493<br>312/334.47 |
| 9,848,701 | B1 * | 12/2017 | Chen | A47B 88/57 |
| 9,854,909 | B1 * | 1/2018 | Chiu | A47B 88/57 |
| 2007/0108880 | A1 * | 5/2007 | Lu | A47B 88/57<br>312/334.11 |
| 2008/0111457 | A1 * | 5/2008 | Ji | A47B 88/493<br>312/334.44 |
| 2008/0124009 | A1 * | 5/2008 | Peng | A47B 88/477<br>384/21 |
| 2018/0270982 | A1 * | 9/2018 | Chen | A47B 88/423 |
| 2024/0324769 | A1 * | 10/2024 | Yao | A47B 88/473 |

* cited by examiner

SLIDING RAIL

CROSS-REFERENCE TO RELATED APPLICATION

This application claims priority to Taiwanese Invention Patent Application No. 112151001, filed on Dec. 27, 2023, the entire disclosure of which is incorporated by reference herein.

FIELD

The disclosure relates to a sliding rail, and more particularly to a sliding rail with locking functions.

BACKGROUND

A conventional sliding rail has a plurality of operating members, and a plurality of unlocking members that are driven by the operating members to move the conventional sliding rail among several unlocked positions. However, since the conventional sliding rail has many components, assembly thereof is hard, the structure thereof takes up plenty of space, and it has a heavy weight and may not have the sufficient structural strength. Furthermore, since the conventional sliding rail has the plurality of operating members, operating positions may change when the conventional sliding rail moves among different locked or unlocked positions. Hence, there is room for improvement.

SUMMARY

Therefore, an object of the disclosure is to provide a sliding rail that can alleviate at least one of the drawbacks of the prior art.

According to the disclosure, the sliding rail is adapted to be engaged with an engaging member. The sliding rail includes a track and a limiting mechanism. The track includes a base wall and two side walls. The two side walls extend respectively and transversely from opposite sides of the base wall. The base wall has first and second ends that are opposite to each other and that are disposed between the side walls. The limiting mechanism includes an operating member, a limiting member, first and second positioning members, and a connecting member. The operating member is movably disposed on the base wall. The limiting member is pivotably connected to the base wall and the operating member. The first and second positioning members extend through the limiting member, are connected to the base wall, and are respectively proximate to and distal from the second end of the base wall. The connecting member extends through the operating member and the limiting member. The limiting member has a limiting body, a pivoting portion, and two limiting portions. The pivoting portion extends from the limiting body. The connecting member pivotally extends through the pivoting portion and the operating member. The two limiting portions extend from the limiting body, and are spaced apart from each other. The operating member is formed with a linking slot that is inverted V-shaped. The connecting member extends movably through the linking slot. The linking slot has a first linking slot end, a second linking slot end that is opposite to the first linking slot end, and a linking slot tip that is disposed between the first linking slot end and the second linking slot end. The limiting body has two pivoting slots spaced apart from each other. The first and second positioning members extend respectively through the pivoting slots. The operating member is operable to drive the limiting member to move among a locked position, a first unlocked position, and a second unlocked position. When the limiting member is in the locked position, the limiting portions and one of the side walls cooperatively define a limiting space that is adapted to contain the engaging member, and the connecting member is disposed at the linking slot tip of the linking slot. When the limiting member is in the locked position, the operating member is movable away from the second end of the base wall to rotate the limiting member about the second positioning member to the first unlocked position by virtue of engagement between the connecting member and the linking slot, thereby opening the limiting space to allow removal of the engaging member from the limiting space. The connecting member is disposed in the second linking slot end of the linking slot when the limiting member is in the first unlocking position. When the limiting member is in the locked position, the operating member is movable away from the first end of the base wall to rotate the limiting member about the first positioning member to the second unlocked position by virtue of the engagement between the connecting member and the linking slot, thereby opening the limiting space to allow removal of the engaging member from the limiting space. The connecting member is disposed in the first linking slot end of the linking slot when the limiting member is in the second unlocked position.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
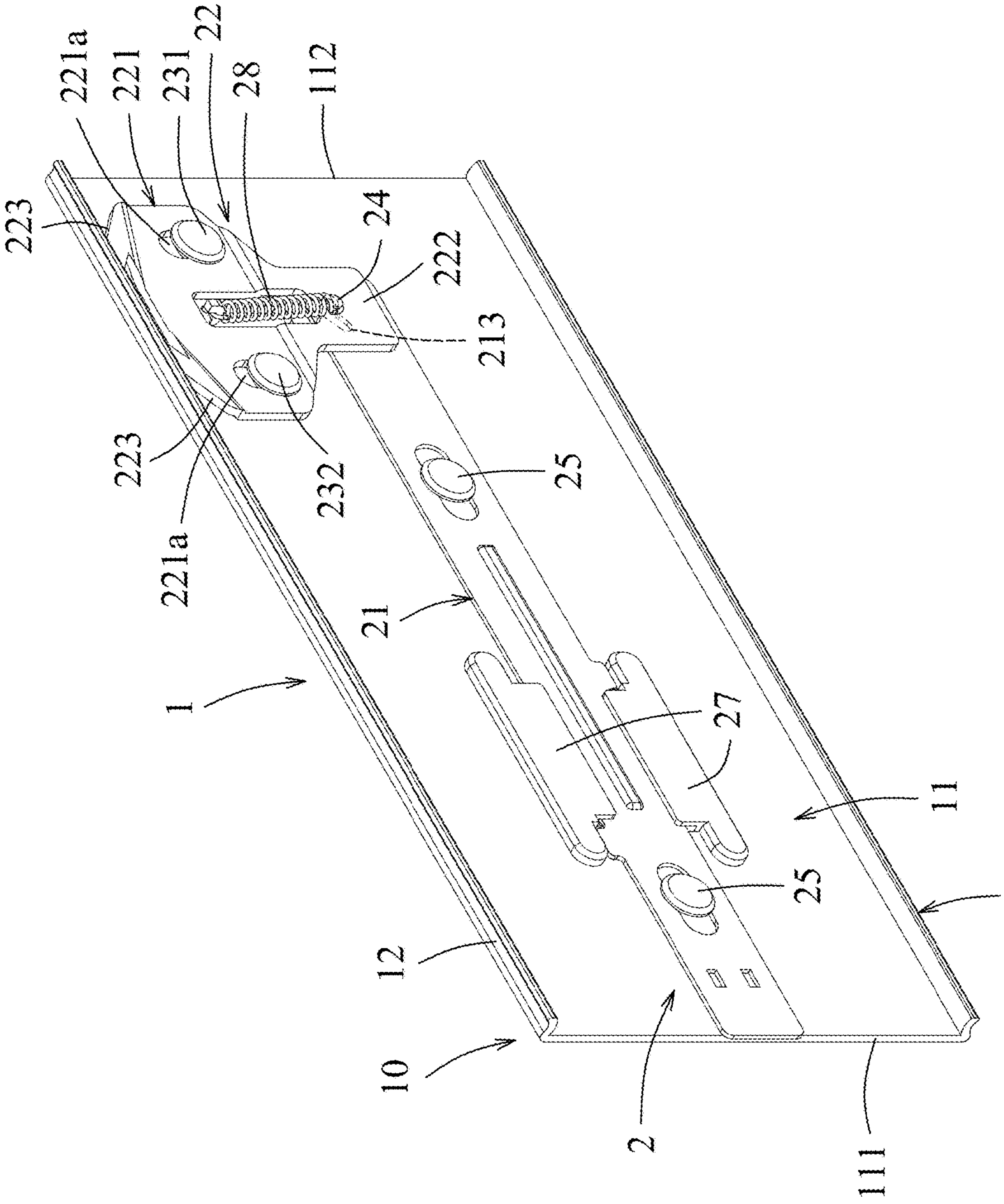
FIG. 1 is a perspective view illustrating an embodiment of a sliding rail according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
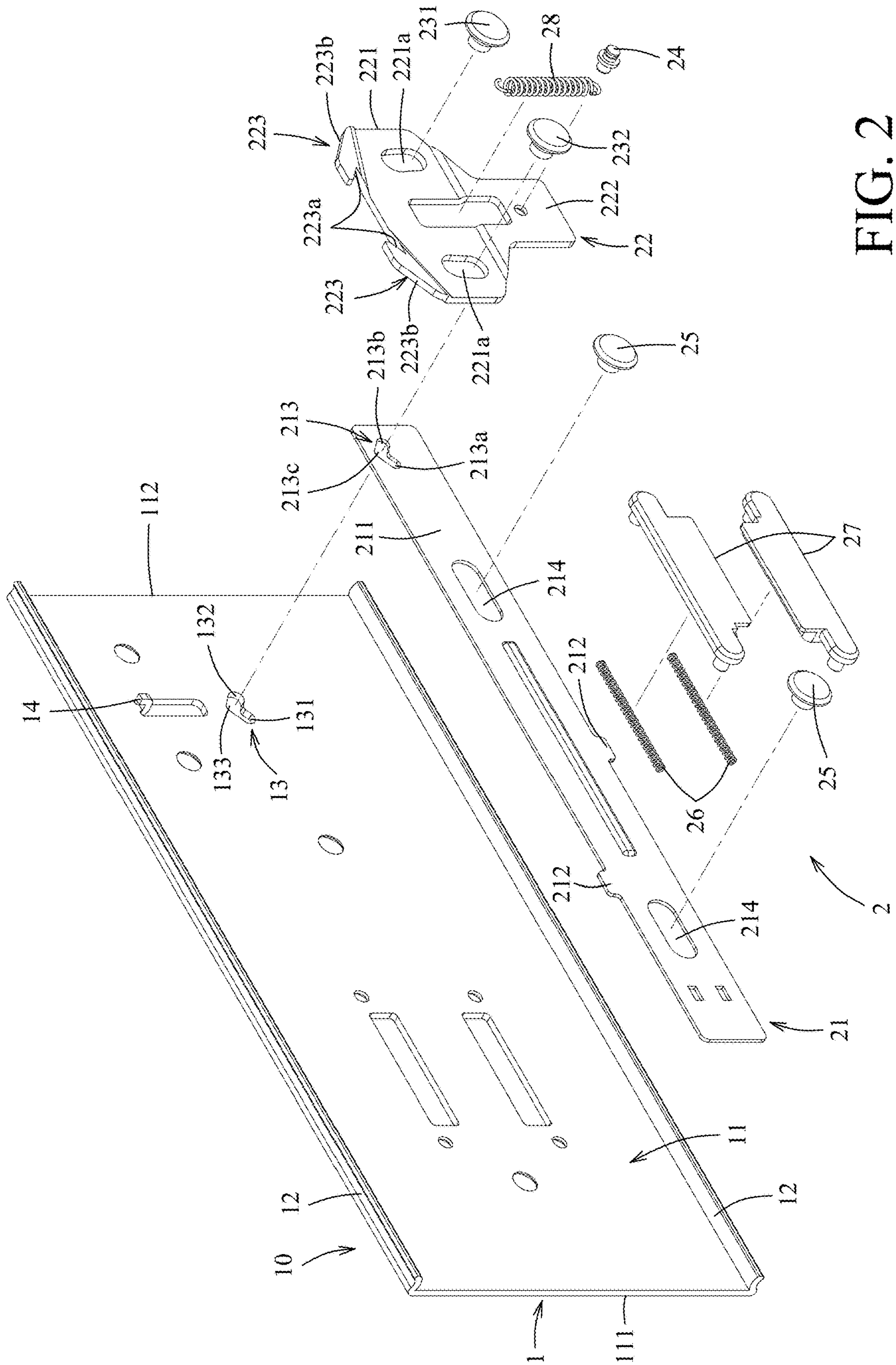
FIG. 2 is an exploded perspective view of the embodiment.
Figure 3:
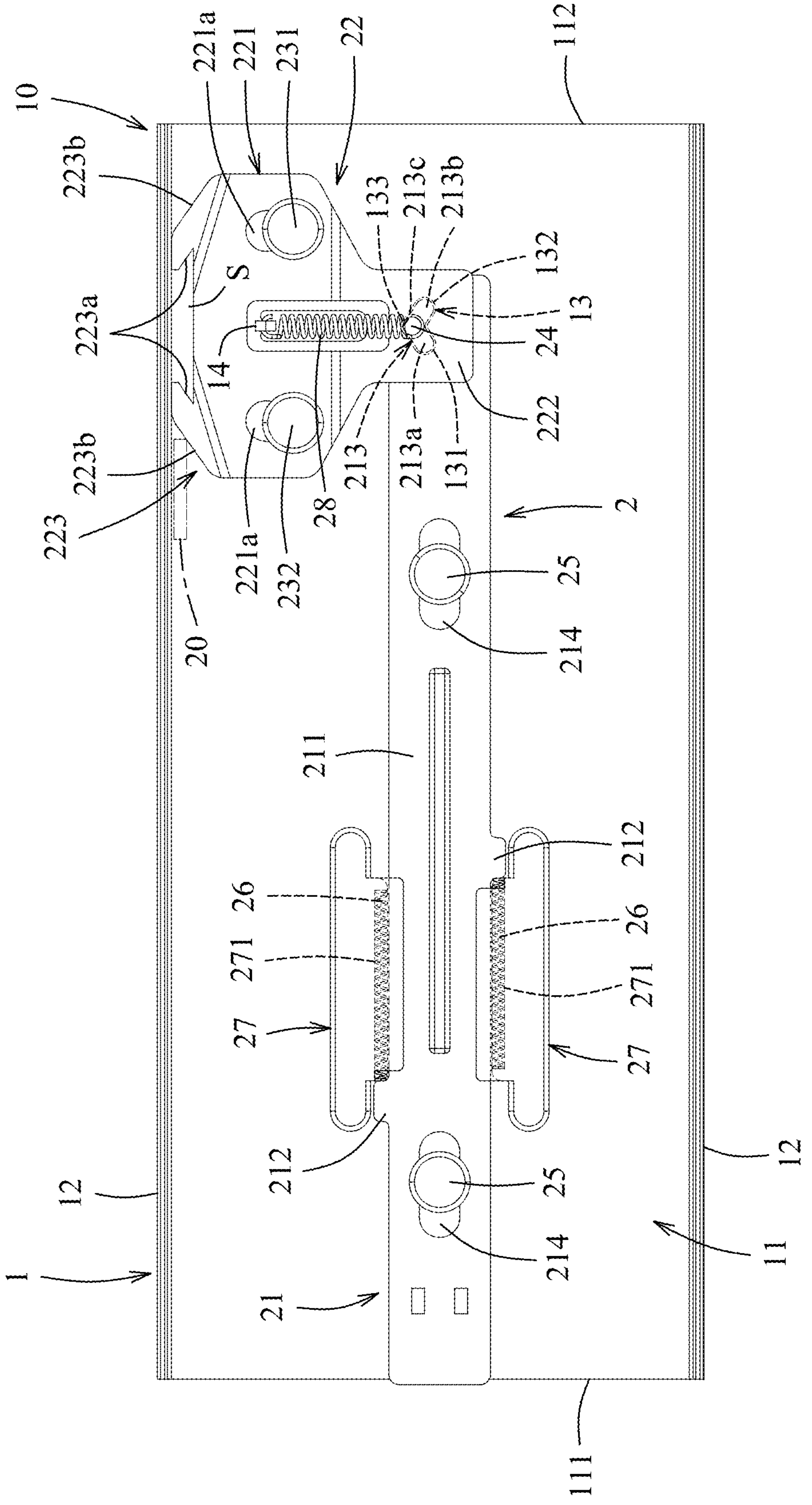
FIG. 3 is a side view of the embodiment, illustrating a limiting member in a locked position, and an engaging member abutting against a limiting portion of the limiting member.

Referring to FIGS. 1 to 3, an embodiment of a sliding rail 10 according to the disclosure is adapted to be engaged with an engaging member 20 of another sliding rail (not shown). The sliding rail 10 includes a track 1 and a limiting mechanism 2.

The track 1 includes a base wall 11, two side walls 12 extending respectively and transversely from opposite sides of the base wall 11, and a hook 14 disposed on said base wall 11. The base wall 11 is formed with a sliding slot 13. A distance between one of the side walls 12 and the hook 14 is shorter than a distance between the sliding slot 13 and the one of the side walls 12. The base wall 11 is elongated in a lengthwise direction, and has first and second ends 111,112 that are opposite to each other in the lengthwise direction and that are disposed between the side walls 12. The side walls 12 are opposite to each other in a transverse direction perpendicular to the lengthwise direction. The sliding slot 13 is inverted V-shaped, and has first and second sliding slot ends 131, 132, that are opposite to each other, and a sliding slot tip 133 that is disposed between the first and second sliding slot ends 131, 132.

The limiting mechanism 2 includes an operating member 21 movably disposed on the base wall 11, a limiting member 22 pivotably connected to the base wall 11 and the operating member 21, first and second positioning members 231, 232 extending through the limiting member 22 and connected to the base wall 11, and respectively proximate to and distal from the second end 112 of the base wall 11, a connecting member 24 extending through the limiting member 22, the operating member 21, and the sliding slot 13, two operating positioning members 25 extending through the operating member 21 and the base wall 11 and spaced apart, a first resilient member 28, two second resilient members 26, and two retainers 27. The operating member 21 has an operating member body 211, two abutment members 212 respectively disposed on opposite sides of the operating member body 211, a linking slot 213 formed in the operating member body 211, and two positioning slots 214 formed in the operating member body 211, elongated in the lengthwise direction, and spaced apart from each other. The operating member body 211 is an elongated plate or sheet. The abutment members 212 are not aligned with respect to each other in the transverse direction. One of the abutment members 212 extends towards the one of the side walls 12, and the other one of the abutment members 212 extends towards the other one of the side walls 12. The connecting member 24 extends movably through the linking slot 213.

The linking slot 213 corresponds in position to the sliding slot 13, is inverted V-shaped, and has a first linking slot end 213*a*, a second linking slot end 213*b* that is opposite to the first linking slot end 213*a*, and a linking slot tip 213*c* that is disposed between the first linking slot end 213*a* and the second linking slot end 213*b*. The operating positioning members 25 respectively extend through the positioning slots 214. By virtue of the configurations of the positioning slots 214 and the operating positioning members 25, the operating member 21 is only movable along a movement path that extends in the lengthwise direction. The retainers 27 are fixed to the base wall 11. Each of the retainers 27 has a retaining slot 271 for accommodating a respective one of the second resilient members 26. Specifically, each of the second resilient members 26 has opposite ends respectively abutting against the respective retainer 27 and a respective one of the abutment members 212. It should be noted that, in other embodiments where the retainers 27 are omitted, the second resilient members 26 may be directly connected to the base wall 11.

The limiting member 22 has a limiting body 221, a pivoting portion 222 extending from the limiting body 221, and two limiting portions 223 extending from the limiting body 221 and spaced apart from each other. The connecting member 24 pivotally extends through the pivoting portion 222. The limiting body 221 has two pivoting slots 221*a* spaced apart from each other. The first and second positioning members 231, 232 extend respectively through the pivoting slots 221*a*. The first resilient member 28 has an end connected to the base wall 11, and an opposite end connected to the connecting member 24. Specifically, the first resilient member 28 has the end hooked on the hook 14, and the opposite end connected to the connecting member 24. The limiting portions 223 extend from the limiting body 221 towards the one of the side walls 12 and are inclined towards each other. Each of the limiting portions 223 has an inner inclined surface 223*a* that faces the other one of the limiting portions 223, and an outer inclined surface 223*b* that is opposite to the inner inclined surface 223*a*. A method for operating the sliding rail 10 is as follows.

Figure 4:
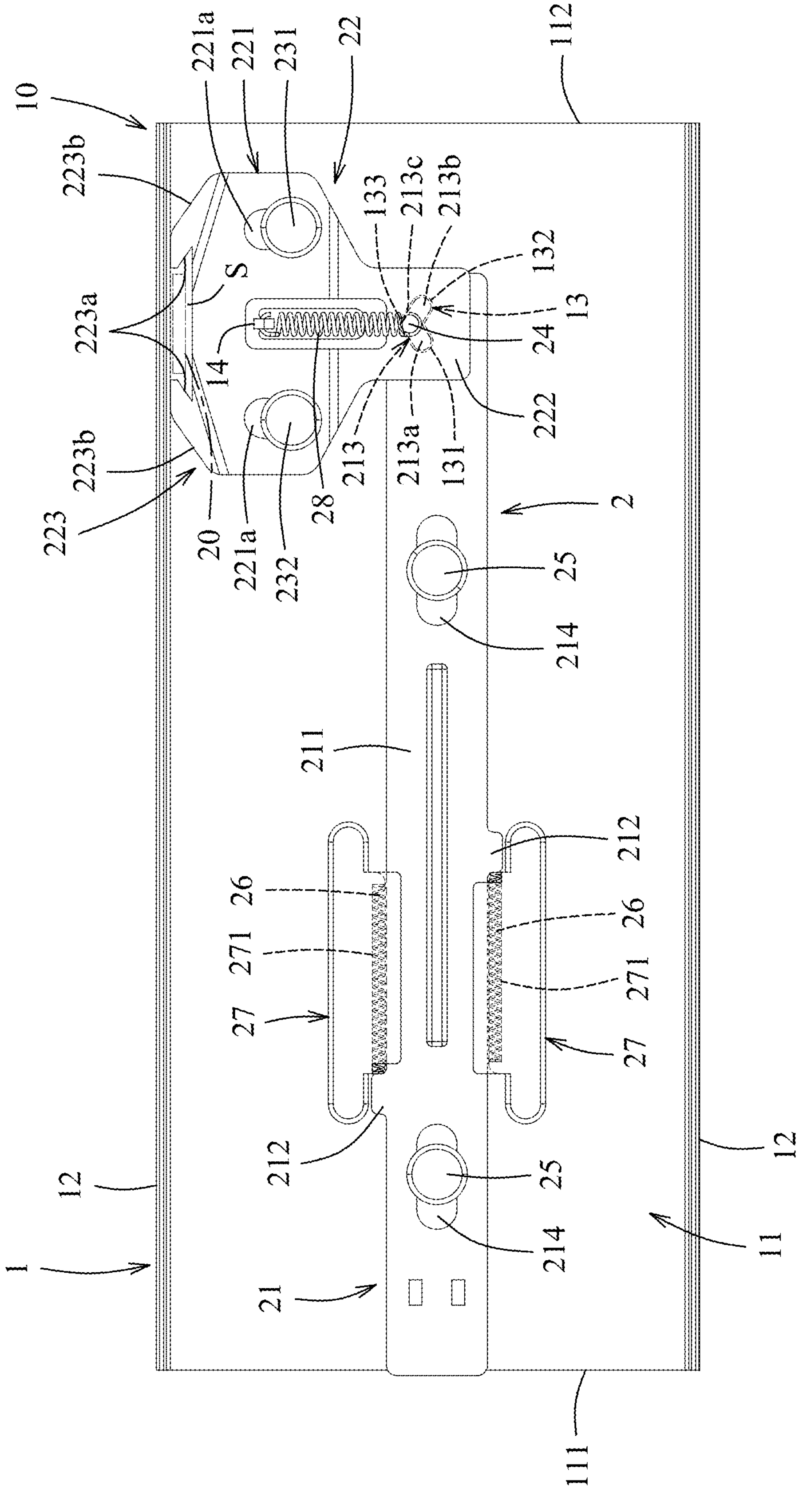
FIG. 4 is a side view of the embodiment, illustrating the limiting member in the locked position, and the engaging member in a limiting space.
Figure 5:
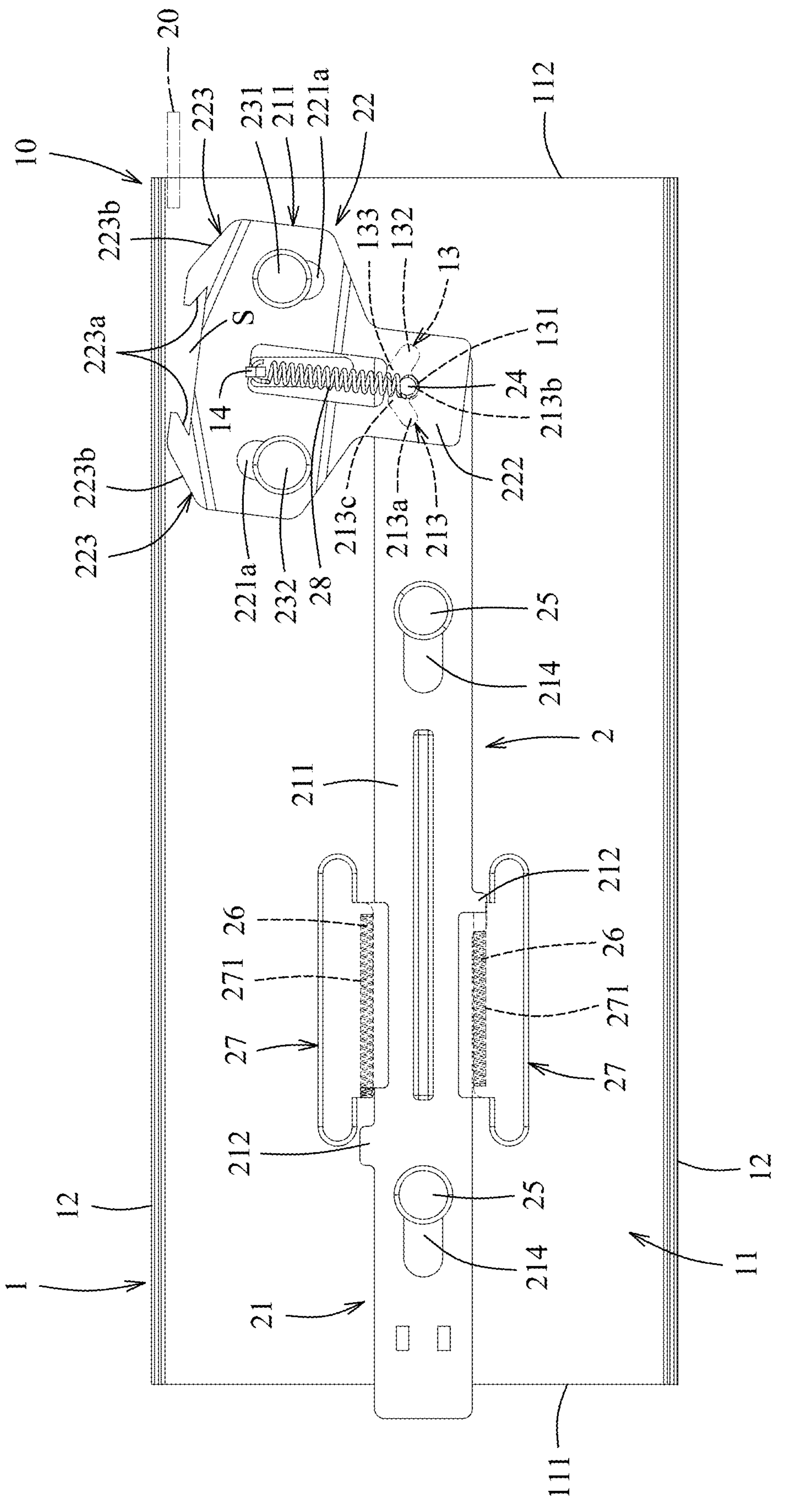
FIG. 5 is a side view of the embodiment, illustrating the limiting member in a first unlocked position, and the engaging member being removed from the limiting space.
Figure 6:
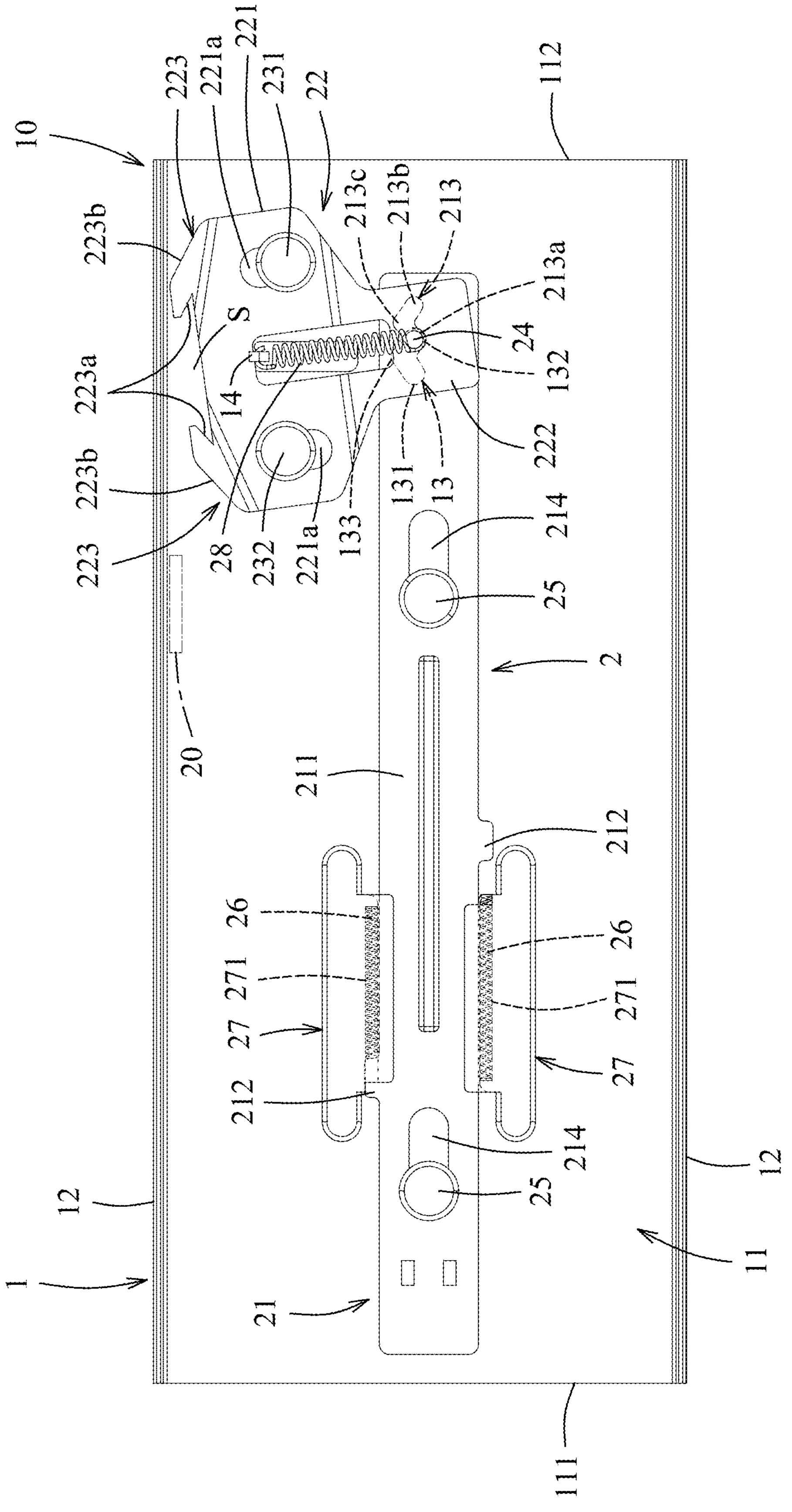
FIG. 6 is a side view of the embodiment, illustrating the limiting member in a second unlocked position, and the engaging member being removed from the limiting space.

Referring to FIGS. 4 to 6, the operating member 21 is operable to drive the limiting member 22 to move among a locked position (FIGS. 3 and 4), a first unlocked position (FIG. 5), and a second unlocked position (FIG. 6). When the limiting member 22 is in the locked position, the limiting portions 223 and the one of the side walls 12 cooperatively define a limiting space(S) that is adapted to contain the engaging member 20, and the connecting member 24 is disposed at the linking slot tip 213*c* of the linking slot 213 and the sliding slot tip 133 of the sliding slot 13. Specifically, referring to FIGS. 3 and 4, when the another sliding rail is moved relative to the sliding rail 10, the engaging member 20 of the another sliding rail is moved to abut the outer inclined surface 223*b* of one of the limiting portions 223 to rotate the limiting member 22, thereby slightly opening the limiting space(S) to allow the engaging member 20 to enter therein. When the limiting member 22 is in the locked position and when the engaging member 20 is in the limiting space(S), the operating member 21 is movable away from the second end 112 of the base wall 11 to rotate the limiting member 22 about the second positioning member 232 to the first unlocked position by virtue of engagement between the connecting member 24 and the linking slot 213, thereby opening the limiting space(S) to allow removal of the engaging member 20 from the limiting space(S) (see FIG. 5), and allowing the another sliding rail to be disengaged from the sliding rail 10. When the limiting member 22 is in the first unlocking position, the connecting member 24 is disposed in the second linking slot end 213*b* of the linking slot 213 and the first sliding slot end 131 of the sliding slot 13. When the limiting member 22 is in the locked position and when the engaging member is in the limiting space(S), the operating member 21 is movable away from the first end 111 of the base wall 11 to rotate the limiting member 22 about the first positioning member 231 to the second unlocked position by virtue of the engagement between the connecting member 24 and the linking slot 213, thereby opening the limiting space(S) to allow removal of the engaging member 20 from the limiting space(S) (see FIG. 6), and allowing the another sliding rail to enter a closed state (i.e., the another sliding rail substantially overlaps with the sliding rail 10). When the limiting member 22 is in the second unlocking position, the connecting member 24 is disposed in the first linking slot end 213*a* of the linking slot 213 and the second sliding slot end 132 of the sliding slot 13.

It should be noted that, the second resilient members 26 reset a position of the operating member 21, and the first resilient member 28 resets a position of the limiting member 22. Specifically, when the limiting member 22 is moved from the locked position to the first unlocked position, one of the second resilient members 26 is compressed against the other one of the abutment members 212 extending towards the other one of the side walls 12, and stores a biasing force that biases the operating member 21 towards the second end 112 of the base wall 11, so that the position of the operating member 21 can be reset. When the limiting member 22 is moved from the locked position to the second unlocked position, the other one of the second resilient members 26 is compressed against the one of the abutment members 212 extending towards the one of the side walls 12, and stores a biasing force that biases the operating member 21 towards the first end 111 of the base wall 11, so that the position of the operating member 21 can be reset. Similarly, when the limiting member 22 is moved from the locked position to the first unlocked position, or from the locked position to the second unlocked position, the first resilient member 28 is compressed, which stores a biasing force that biases the limiting member 22 towards the locked position.

In conclusion, since the operating member 21 is operable to drive the limiting member 22 to move among the locked position, the first unlocked position, and the second unlocked position, the sliding rail 10 may achieve different unlocking functions by operating the operating member 21. Hence, the sliding rail 10, in comparison to the aforementioned conventional sliding rail, has less components, and is easier to be assembled, and no matter what the desired unlocking function is, the operating position does not change. The sliding rail 10 also reduces the structure space and the weight compared to the conventional sliding rail, and has a stronger structural strength by having less components. Hence, an objective of the disclosure is achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A sliding rail adapted to be engaged with an engaging member, said sliding rail comprising:

a track that includes
- a base wall, and
- two side walls extending respectively and transversely from opposite sides of said base wall, said base wall having first and second ends that are opposite to each other and that are disposed between said side walls; and a limiting mechanism that includes
- an operating member movably disposed on said base wall,
- a limiting member pivotably connected to said base wall and said operating member;
- first and second positioning members extending through said limiting member, connected to said base wall, and respectively proximate to and distal from said second end of said base wall; and
- a connecting member extending through said operating member and said limiting member;

wherein said limiting member has
- a limiting body,
- a pivoting portion extending from said limiting body, said connecting member pivotally extending through said pivoting portion and said operating member, and
- two limiting portions extending from said limiting body, and spaced apart from each other;

wherein said operating member is formed with a linking slot that is inverted V-shaped, said connecting member extending movably through said linking slot, said linking slot having
- a first linking slot end,
- a second linking slot end that is opposite to said first linking slot end, and
- a linking slot tip that is disposed between said first linking slot end and said second linking slot end;

wherein said limiting body has two pivoting slots spaced apart from each other, said first and second positioning members extending respectively through said pivoting slots;

wherein said operating member is operable to drive said limiting member to move among a locked position, a first unlocked position, and a second unlocked position;

wherein, when said limiting member is in the locked position, said limiting portions and one of said side walls cooperatively define a limiting space that is adapted to contain the engaging member, and said connecting member is disposed at said linking slot tip of said linking slot;

wherein, when said limiting member is in the locked position, said operating member is movable away from said second end of said base wall to rotate said limiting member to the first unlocked position about said second positioning member by virtue of engagement between said connecting member and said linking slot, thereby opening said limiting space to allow removal of the engaging member from said limiting space, said connecting member being disposed in said second linking slot end of said linking slot when said limiting member is in the first unlocked position; and wherein, when said limiting member is in the locked position, said operating member is movable away from said first end of said base wall to rotate said limiting member about said first positioning member to the second unlocked position by virtue of the engagement between said connecting member and said linking slot, thereby opening said limiting space to allow removal of the engaging member from said limiting space, said connecting member being disposed in said first linking slot end of said linking slot when said limiting member is in the second unlocked position.

2. The sliding rail as claimed in claim 1, wherein said limiting portions extend from said limiting body towards said one of said side walls and are inclined toward each other, each of said limiting portions having an inner inclined surface that faces the other one of said limiting portions, and an outer inclined surface that is opposite to said inner inclined surface.

3. The sliding rail as claimed in claim 1, wherein:

said base wall is formed with a sliding slot that corresponds in position to said linking slot, said connecting member extending through said sliding slot, said sliding slot being inverted V-shaped, and having first and second sliding slot ends that are opposite to each other, and a sliding slot tip that is disposed between said first and second sliding slot ends;

when said limiting member is in the locked position, said connecting member is disposed at said sliding slot tip;

when said limiting member is in the first unlocked position, said connecting member is disposed in said first sliding slot end; and when said limiting member is in the second unlocked position, said connecting member is disposed in said second sliding slot end.

4. The sliding rail as claimed in claim 1, wherein said limiting mechanism further includes a first resilient member that has an end connected to said base wall, and an opposite end connected to said connecting member.

5. The sliding rail as claimed in claim 1, wherein:

said limiting mechanism further includes two second resilient members;

said operating member has an operating member body formed with said linking slot, and two abutment members respectively disposed on opposite sides of said operating member body; and each of said second resilient members has opposite ends respectively connected to said base wall and abutting against a respective one of said abutment members.

6. The sliding rail as claimed in claim 5, wherein said limiting mechanism further includes two retainers fixed to said base wall, each of said retainers having a retaining slot that accommodates a respective one of said second resilient members.

* * * * *